United States Patent [19]
Patel

[11] Patent Number: 5,305,344
[45] Date of Patent: Apr. 19, 1994

[54] LASER DIODE ARRAY

[75] Inventor: Rushikesh M. Patel, Pomona, Calif.

[73] Assignee: Opto Power Corporation, Industry, Calif.

[21] Appl. No.: 55,681

[22] Filed: Apr. 29, 1993

[51] Int. Cl.$^5$ ........................................... H01L 21/20
[52] U.S. Cl. ..................................... 372/50; 437/129;
437/902; 257/625; 257/675; 257/718; 257/719;
372/36
[58] Field of Search ................... 437/129, 902; 372/50;
257/81, 89, 128–180, 625, 675, 706, 707, 718,
719

[56] References Cited

U.S. PATENT DOCUMENTS

| | | |
|---|---|---|
| 4,092,614 | 5/1978 | Sakuma et al. |
| 4,383,270 | 5/1983 | Schelhorn ............... 257/675 |
| 4,573,067 | 2/1986 | Tuckerman et al. |
| 4,617,585 | 10/1986 | Yasui ..................... 257/675 |
| 4,877,641 | 10/1989 | Dory ...................... 437/243 |
| 4,881,237 | 11/1989 | Donnelly ................ 372/50 |
| 5,040,187 | 8/1991 | Karpinski ............... 372/50 |
| 5,099,488 | 3/1992 | Ahrabi et al. ........... 372/36 |
| 5,156,999 | 10/1992 | Lee ........................ 437/902 |

FOREIGN PATENT DOCUMENTS

| | | | |
|---|---|---|---|
| 0458469 | 11/1991 | European Pat. Off. ............ 257/675 |
| 55-65450 | 5/1980 | Japan ................... 257/625 |
| 3269325 | 11/1987 | Japan ................... 257/675 |
| 9000036 | 8/1990 | World Int. Prop. O. ......... 437/902 |

OTHER PUBLICATIONS

Bhattacharya et al. IBM Tech. Dis. Bull. 21(2), Jul. 1978, pp. 613 614.
IBM Tech. Dis. Bull. 31(12), May 1989, pp. 5 7.
IBM Tech. Dis. Bull. 31(6), Nov. 1988, pp. 372 373.

*Primary Examiner*—Olik Chaudhuri
*Assistant Examiner*—Ramamohanrao Paladugu
*Attorney, Agent, or Firm*—Herbert M. Shapiro

[57] ABSTRACT

Modified laser submounts are positioned in grooves in the surface of a monolithic substrate permitting not only relatively high packing diversities, but also pretesting and easy replacement of any submounts which may later become defective in the field. The assembly may be connected directly to a heat sink or may include an integral microchannel cooler.

6 Claims, 3 Drawing Sheets

LASER DIODE ARRAY

FIELD OF THE INVENTION

This invention relates to laser diode arrays and more particularly to such array assemblies which permit pretesting of laser components and easy replacement of such components in the field after manufacture.

BACKGROUND OF THE INVENTION

U.S. Pat. No. 5,040,187 issues Aug. 13, 1991, discloses a diode laser array assembly in which laser diodes are positioned in grooves formed in the surface of a monolithic substrate. This substrate is of a shape to permit flexing to enlarge the grooves to accept the lasers. Once the lasers are positioned, the near surface of the substrate is connected to a heat sink.

U.S. Pat. No. 4,881,237 issued November 1989 disclosed a laser array assembly where the lasers are positioned in grooves formed in the surface of a monolithic substrate on the back surface of which a microchannel cooler is formed. A micro channel cooler structure is disclosed in U.S. Pat. No. 4,573,067 issued Feb. 25, 1986.

BRIEF DESCRIPTION OF AN ILLUSTRATIVE EMBODIMENT OF THIS INVENTION

In accordance with the principles of this invention, laser diode submounts, rather than laser diodes, are inserted into grooves in the top surface of a monolithic substrate. The bottom surface of the substrate is adapted for bonding to a heat sink in one embodiment or includes a microchannel cooler in another embodiment.

Commercial submounts available from the assignee of the present application, include a base on which a mesa is formed to provide a recessed area in which a laser bar is placed. Such submounts are reconfigured herein to provide a rear-extending pedestal for insertion into a substrate surface groove. The pedestal allows for positioning of pretested submounts for easy removal of a submount for replacement if it should later become defective in the field. It is submitted that the reconfiguring of a submount for connection to substrate surface groove as well as the recognition that significant advantages are afforded by the positioning of such modified submounts into such grooves represent significant departures from prior thinking.

DETAILED DESCRIPTION OF AN ILLUSTRATIVE EMBODIMENT OF THE INVENTION

Figure 1:
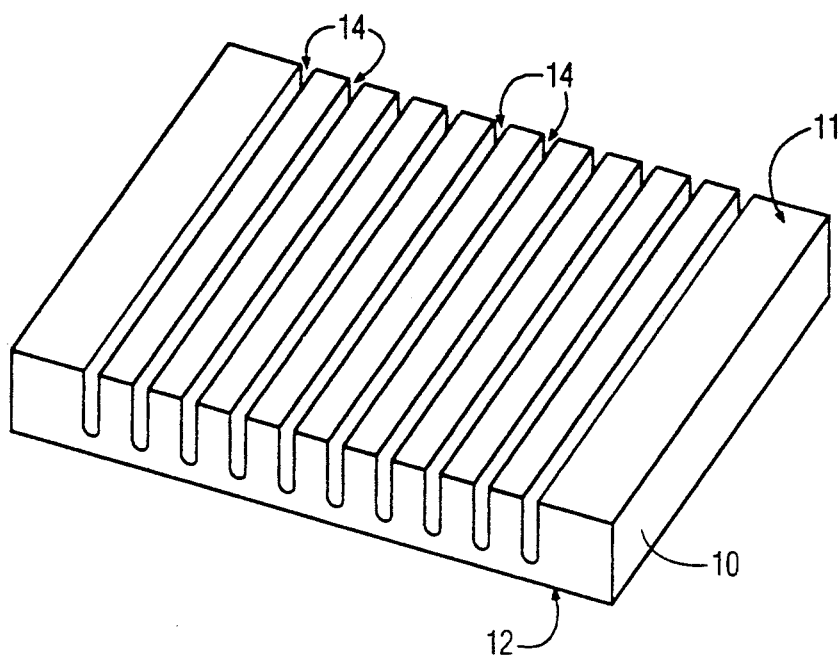
FIG. 1 is a schematic representation of a substrate position of a laser array assembly in accordance with the principles of the invention.
Figure 2:
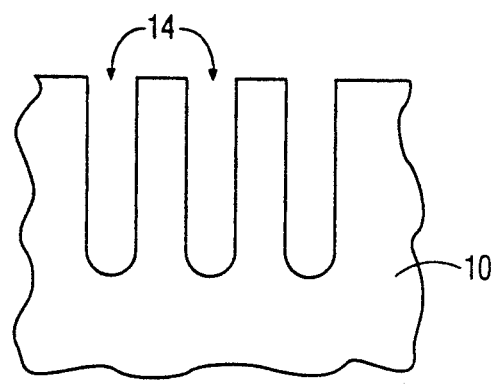
FIG. 2 is a schematic side view of the substrate position of FIG. 1.

FIG. 1 shows a substrate 1 0 having first and second major surfaces 11 and 12. A plurality of parallel grooves 14 is formed in surface 11. FIG. 2 shows grooves 14 in side view.

Figure 3:
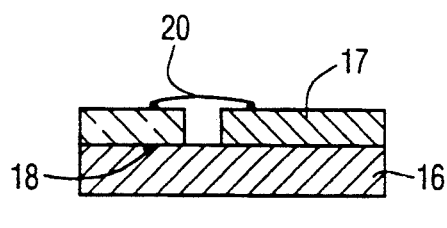
FIG. 3 is a schematic cross sectional view of a laser submount.

FIG. 3 shows a cross sectional view of laser submount available from the assignee of the present application. The submount includes a substrate (16) of tungsten-Copper with an aluminum oxide ($Al_2O_3$) on aluminum niobium (AlN) mesa or spacer 17. The mesa occupies the surface of the right portion of the substrate as viewed in FIG. 3 and leaves the left-extending surface portion 18 free. A laser bar is connected to that free surface portion and a gold foil 20 electrically connects the laser bar to the mesa.

Figure 4:
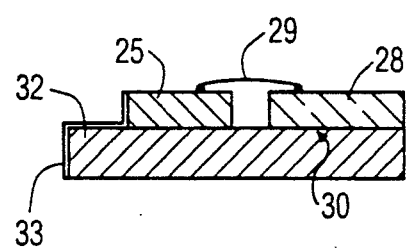
FIG. 4 is a schematic cross sectional view of a laser submount subassembly in accordance with the principles of this invention.

In accordance with the principles of this invention, a mesa 25 also is formed on the surface of a substrate 26 as shown in FIG. 4. Also a laser bar 28 is positioned on the substrate and connected to the mesa via gold foil 29. But, in this instance an extension 32 remains forming a pedestal extending to the left as viewed in FIG. 4. This pedestal is coated with an electrically-conducting layer 33 thus completing a laser "submount" adapted for insertion into a groove 14 of FIG. 1.

Figure 5:
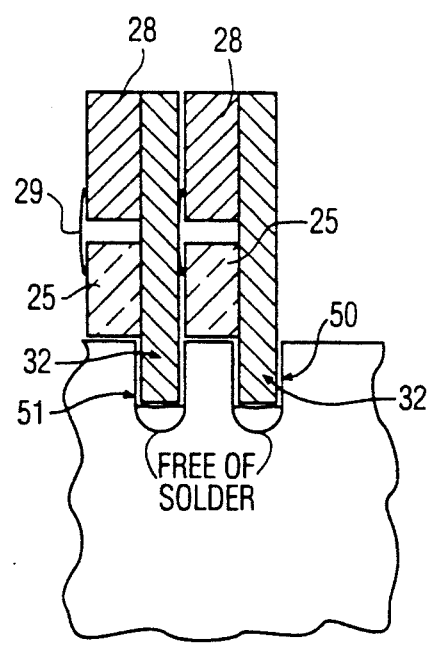
FIG. 5 is a schematic side view of the sub-assembly of FIG. 4 and the substrate of FIG. 1 interconnected from an assembly in accordance with the principles of this invention.

FIG. 5 shows first and second laser submounts, as shown in FIG. 4, with pedestals inserted into adjacent grooves 50 and 5 1. Specifically, pedestal 32 of each submount is inserted into a groove and soldered in place. Mesas 25 and laser bars 28 are shown extending to the left of the respective substrate in each instance leaving room only for gold contacts 29. The assembly can be seen to be compact allowing for relatively high density laser arrays to be realized.

Figure 6:
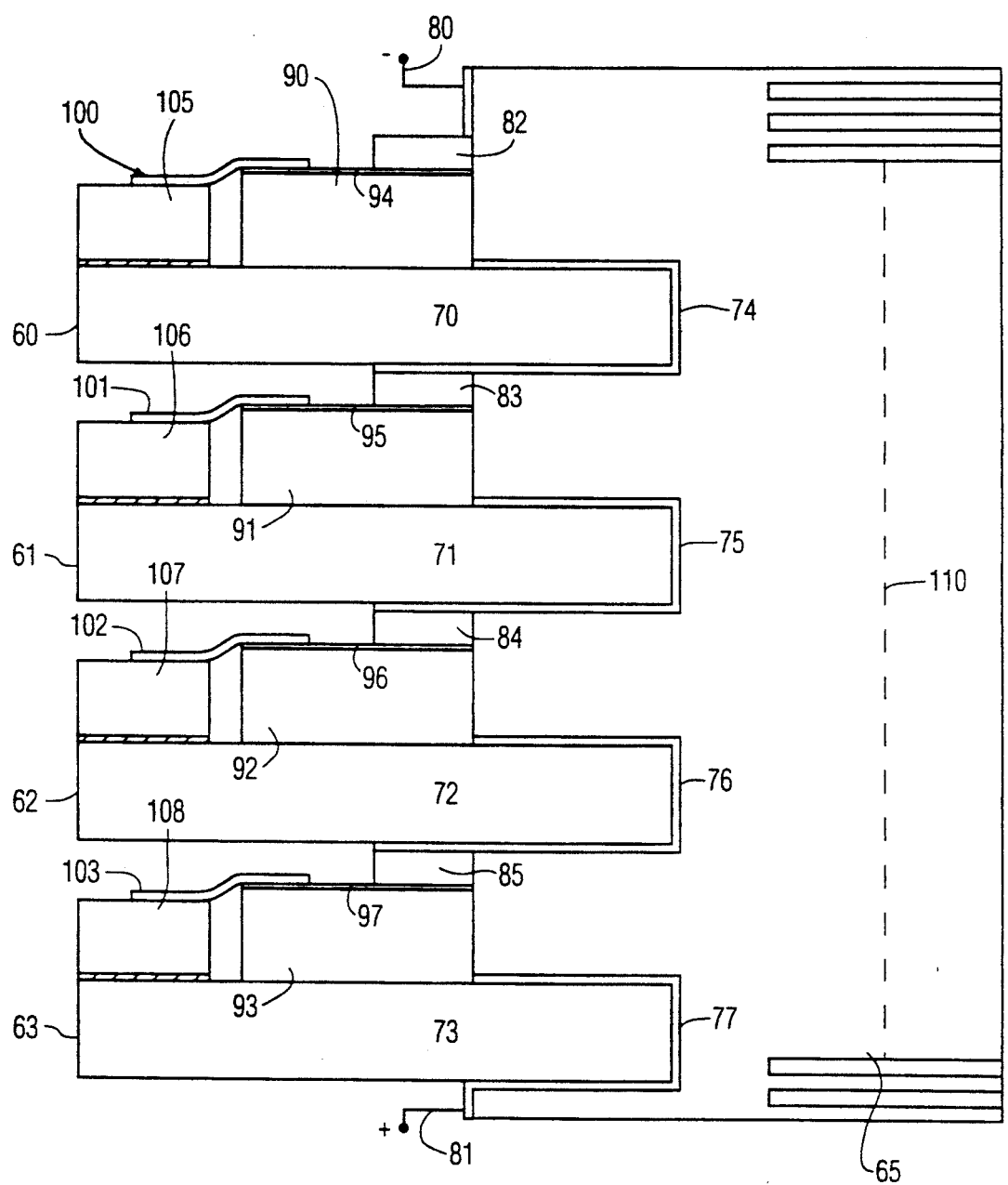
FIG. 6 is a schematic representation of a practical embodiment of the assembly of FIG. 5.

FIG. 6 shows an enlarged schematic view of a portion of a laser array in accordance with this invention. The array shows four laser bar submounts 60, 61, 62, and 63 with pedestals inserted into a channel substrate 65. Each submount substrate 70, 71, 72 and 73 is made of tungsten-copper and thus is electrically conducting. The solder bonds 74, 75, 76, and 77 connect the submounts into a series circuit between negative terminal 80 and positive terminal 81 through copper spacers 82, 83, 84 and 85 and submount substrates 70, 71, 72 and 73. Mesas (or spacers) of $Al_2O_3$ or AlN 90, 91, 92 and 93 provide electrical isolation. But gold surface layers 94, 95, 96 and 97 provide electrical continuity between copper spacers 82, 83, 84 and 85 and gold foils 100, 101, 102 and 103 to laser bars 105, 106, 107 and 108, respectively.

The rear surface of channel substrate 65 includes a microchannel cooler 110. An integral microchannel cooler provides superior cooling characteristics to known attached heat sinks. Even though such an integral cooler renders the laser array rigid and incapable of flexing, individual laser submounts can be removed in the field by reflowing the solder layer (74, 75, 76 and 77) by raising the temperature of the array to the above the melting point of the solder, removing the defective submount and inserting a replacement submount before lowering the temperature of the array. A relatively low melting point solder, of course, is employed to join the submounts to the channel substrate in order to avoid damage to other connections between components of the submounts.

What is claimed is:

1. A laser array assembly comprising a structurally stable substrate having first and second major surfaces, said substrate including a plurality of grooves in said first major surface, each of said grooves having side walls and a bottom portion, each of said side walls including a layer of electrically conducting material, said bottom portion being free of electrically conducting material, said grooves including at least one laser submount, each of said submounts comprising a substrate with a mesa positioned thereon to define a rear extending pedestal and a forward extending portion, said submount including a laser attached to said forward extending portion and being electrically connected to said mesa, said rear extending pedestal being positioned in one of said grooves and electrically and thermally connected to said layers on said side walls.

2. An assembly as set forth in claim 1 wherein said substrate includes a micro channel cooler at said second surface.

3. An assembly as set forth in claim 1 wherein each of said grooves includes a laser submount.

4. An assembly as set forth in claim 3 wherein said substrate includes a heat sink integral therewith.

5. An assembly as set forth in claim 4 wherein said heat sink comprises micro channel cooler.

6. An assembly as set forth in claim 3 wherein said substrate is connected to a heat sink.

* * * * *